(12) United States Patent
Van Houdt et al.

(10) Patent No.: US 10,403,627 B2
(45) Date of Patent: Sep. 3, 2019

(54) MEMORY DEVICE FOR A DYNAMIC RANDOM ACCESS MEMORY

(71) Applicant: IMEC vzw, Leuven (BE)

(72) Inventors: Jan Van Houdt, Bekkevoort (BE); Julien Ryckaert, Schraerbeek (BE); Hyungrock Oh, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/729,532

(22) Filed: Oct. 10, 2017

(65) Prior Publication Data

US 2018/0102365 A1    Apr. 12, 2018

(30) Foreign Application Priority Data

Oct. 11, 2016  (EP) .................................. 16193247

(51) Int. Cl.
  *G11C 5/06* (2006.01)
  *G11C 5/02* (2006.01)
  (Continued)

(52) U.S. Cl.
  CPC .......... *H01L 27/108* (2013.01); *G11C 11/405* (2013.01); *G11C 11/4097* (2013.01);
  (Continued)

(58) Field of Classification Search
  CPC .............. G11C 11/405; G11C 11/4097; G11C 11/4076; G11C 11/4094; H01L 27/108;
  (Continued)

(56) References Cited

U.S. PATENT DOCUMENTS 6,229,758 B1 * 5/2001 Agata .................. G11C 7/1072
365/149
6,982,897 B2   1/2006 Luk et al.
(Continued)

FOREIGN PATENT DOCUMENTS

EP    2 884 666 A1    6/2015

OTHER PUBLICATIONS

Atsumi et al., "DRAM Using Crystalline Oxide Semiconductor for Access Transistors and not Requiring Refresh for More Than Ten Days" (2012).

(Continued)

*Primary Examiner* — Ly D Pham
(74) *Attorney, Agent, or Firm* — Knobbe Martens Olson & Bear, LLP (57) ABSTRACT

The disclosed technology relates to a memory device for a dynamic random access memory, or DRAM. In one aspect, the memory device includes a substrate supporting a semiconductor device layer in which a plurality of semiconductor devices are formed. The memory device may further include an interconnection portion formed above the substrate and including a number of metallization levels and dielectric layers, the interconnection portion being adapted to interconnect said semiconductor devices. The memory device may further include a plurality of bit cell stacks arranged in the interconnection portion, each bit cell stack including a plurality of bit cells. Further, such bit cells may include elements such as a charge storage element, a write transistor, and a read transistor.

20 Claims, 5 Drawing Sheets

(51) Int. Cl.
*H01L 23/528* (2006.01)
*H01L 27/108* (2006.01)
*G11C 11/405* (2006.01)
*H01L 21/8254* (2006.01)
*G11C 11/4097* (2006.01)
*G11C 13/00* (2006.01)
*G11C 5/04* (2006.01)
*H01L 25/065* (2006.01)
*G11C 11/4076* (2006.01)
*H01L 49/02* (2006.01)
*G11C 11/4094* (2006.01)

(52) U.S. Cl.
CPC .......... *H01L 21/8254* (2013.01); *G11C 5/025* (2013.01); *G11C 5/04* (2013.01); *G11C 5/06* (2013.01); *G11C 11/4076* (2013.01); *G11C 11/4094* (2013.01); *G11C 13/004* (2013.01); *G11C 13/0069* (2013.01); *G11C 2213/71* (2013.01); *H01L 23/528* (2013.01); *H01L 25/0657* (2013.01); *H01L 27/10805* (2013.01); *H01L 28/60* (2013.01)

(58) Field of Classification Search
CPC ........................................ H01L 21/8254; H01L 27/10805; H01L 28/60
USPC .......................................................... 365/63
See application file for complete search history.

(56) References Cited

U.S. PATENT DOCUMENTS

| | | | |
|---|---|---|---|
| 9,177,872 B2 | 11/2015 | Sandhu | |
| 9,450,581 B2* | 9/2016 | Tamura | H03K 19/0013 |
| 2005/0073871 A1* | 4/2005 | Luk | G11C 11/405 |
| | | | 365/149 |
| 2010/0165704 A1* | 7/2010 | Wu | G11C 11/405 |
| | | | 365/149 |
| 2011/0026323 A1* | 2/2011 | Luk | G11C 11/36 |
| | | | 365/175 |
| 2013/0070506 A1 | 3/2013 | Kajigaya | |
| 2014/0353648 A1* | 12/2014 | Abe | H01L 29/247 |
| | | | 257/40 |
| 2017/0062024 A1* | 3/2017 | Giterman | G11C 11/403 |
| 2017/0294221 A1* | 10/2017 | Giterman | G11C 11/41 |

OTHER PUBLICATIONS

Inoue et al., "Nonvolatile Memory With Extremely Low-Leakage Indium-Gallium-Zinc-Oxide Thin-Film Transistor" *IEEE Journal of Solid-State Circuits*, vol. 47, No. 9, pp. 2258-2265, (Sep. 2012).
Matsubayashi et al., "20-nm-node trench-gate-self-aligned crystalline In—Ga—Zn-Oxide FET with high frequency and low off-state current", pp. 6.5.1-6.5.4 (2015).
Matsuzaki et al., "1Mb Non-Volatile Random Access Memory Using Oxide Semiconductor" (2012).
Matsuzaki et al., "A 16-Level-Cell Nonvolatile Memory with Crystalline In—Ga—Zn Oxide FET", pp. 125-128, (2015).
Matsuzaki et al,, "A 16-level-cell memory with c-axis-aligned a-b-plane-anchored crystal In—Ga—Zn oxide FET using threshold voltage cancel write method", *Japanese Journal of Applied Physics*, vol. 55, pp. 04EE02-1-04EE02-6, (Feb. 26, 2016).

* cited by examiner

Fig. 5

MEMORY DEVICE FOR A DYNAMIC RANDOM ACCESS MEMORY

CROSS-REFERENCE TO RELATED APPLICATIONS

This application claims foreign priority to European Application No. EP 16193247.0, filed Oct. 11, 2016, which is incorporated herein by reference in entirety.

BACKGROUND

Field

The disclosed technology relates to a memory device for a dynamic random access memory (DRAM) as well as to methods for operating a DRAM.

Description of the Related Technology

DRAM is a type of random access memory wherein each bit cell comprises a capacitor for storing a bit of data and a transistor for accessing the capacitor. The level of charge on the capacitor determines whether that particular bit cell comprises a logical "1" or "0". The bit cells are typically arranged in a two-dimensional array, in which each row is connected to a respective word line and each column is connected to a respective bit line. The word lines may be used for addressing the bit cells of a specific row, whereas the bit lines may be used for reading and writing the data on the individual bit cells of the addressed row.

The effort to reduce bit cell area and increased circuit density has led to a demand for capacitors, such as e.g. pillar type capacitors, having a reduced footprint. However, since a reduction of the physical dimensions of the capacitor may lead to a reduced capacitance, impairing the operation of the bit cell, the reduced footprint may be compensated by an increased aspect ratio of the capacitor. Further scaling of the bit cells would hence involve even higher aspect ratios in order to provide sufficient capacitance and sufficiently low leakage. Eventually a physical scaling limit may be reached, beyond which the required aspect ratio of the capacitor can no longer be met.

Thus, there is a need for improved DRAM technologies that allow for further reduction of the memory cell area without impairing the performance and function of the DRAM device.

SUMMARY OF CERTAIN INVENTIVE ASPECTS

An objective of the disclosed technology is accordingly to provide a memory device for a DRAM which allows for further reduction of the memory cell area without impairing the performance and function of the DRAM device. Additional and alternative objectives may be understood from the following.

According to an aspect of the disclosed technology there is provided a memory device for a dynamic random access memory, DRAM. The memory device includes a substrate supporting a semiconductor device layer in which a plurality of semiconductor devices are formed. The memory device further includes an interconnection portion formed above the substrate and including a number of metallization levels and dielectric layers, the interconnection portion being adapted to interconnect the semiconductor devices The memory device further includes a plurality of bit cell stacks arranged in the interconnection portion, each bit cell stack including a plurality of bit cells. Further, each bit cell may include: (i) a charge storage element, a write transistor and a read transistor, wherein the write transistor includes a gate electrode connected to a write select line and a first electrode connected to a write bit line, wherein the charge storage element includes a first portion connected to a read select line and a second portion connected to a second electrode of the write transistor and to a gate electrode of the read transistor, and wherein the read transistor includes an electrode connected to a sense line, (ii) driver circuitry adapted to during a read mode apply a voltage to a read select line connected to a bit cell such that a gate voltage of the read transistor of the bit cell, on a condition that a first charge is stored by the charge storage element of the bit cell, is shifted to a first voltage which is smaller than a threshold voltage of the read transistor and, on a condition that a second charge is stored by the charge storage element of the bit cell, is shifted to a second voltage which is equal to or greater than the threshold voltage of the read transistor, and (iii) a plurality of gain transistors formed in the semiconductor device layer, each gain transistor being connected to a respective one of the bit stacks via the sense lines connected to the read transistor of each bit cell of the respective bit stack and being adapted to output an amplified read out signal.

By stacking bit cells in the interconnection portion above the substrate the area efficiency of the memory device may be improved since a vertical stacking direction provides an additional scaling path compared to conventional planar memory arrays. Implementing the bit cells in the interconnection portion also makes it possible to form the bit cells at more relaxed dimensions. This may translate to reduced processing costs for forming the devices of the bit cells, e.g. by relaxed resolution requirements on lithographic processes.

The substrate supports the semiconductor device layer in which a plurality of semiconductor devices are formed or implemented. The (semiconductor) device layer may extend laterally or horizontally along a main surface of the substrate. The semiconductor device layer may be referred to as a front end of line (FEOL) portion of the substrate or the memory device.

The interconnection portion may include one or more metallization levels and one or more dielectric layers. Each metallization level may include a metallization layer. Metallization layers of adjacent metallization levels may be separated by a dielectric layer. The metallization layers may include conducting patterns or paths electrically interconnecting devices of the FEOL portion and/or portions (such as source, drain or gate) of individual semiconductor devices of the FEOL portion. The interconnection portion may include conducting vias connecting metallization layers through a dielectric layer. The interconnection portion may be referred to as a back end of line (BEOL) portion of the substrate or the memory device.

The interconnection portion is formed above the device layer. In other words the BEOL portion is formed above the FEOL portion. Here, "above" means that the BEOL portion is formed above the FEOL, as viewed along the stacking direction of the bit cell stacks, or as viewed in a vertical direction from the main surface of the substrate. hence, the terminology "above" does not refer to an absolute orientation of the BEOL/FEOL portions but to a relative ordering thereof.

As used herein, a bit cell stack means a stack of bit cells wherein the bit cells of the stack are arranged at different heights above the substrate. The bit cells of each stack may be arranged at or in different metallization levels in the interconnection region. The plurality of bit cell stacks may in turn be arranged in an array fashion, aligned in rows and columns of the array.

Reference to the bit cell stacks being arranged in the interconnection portion/BEOL portion herein means that each bit cell including the write transistor, the read transistor and the charge storage element is implemented or encapsulated within the BEOL portion.

According to implementations herein, the write transistor of each bit cell may be a transistor including a channel region formed in the interconnection region. Similarly, the read transistor of each bit cell may be a transistor including a channel region formed in the interconnection region. Further, the write transistor and the read transistor of each bit cell of a bit stack may be formed in a different level in the interconnection region than the write transistor and the read transistor of a bit cell above or below the bit cell.

The write transistor of each bit cell may be a field-effect transistor (FET). In particular the write transistor may be an n-type FET.

The read transistor of each bit cell may be a FET. In particular the read transistor may be an n-type FET.

The first and the second portions of the charge storage element may be capacitively coupled and separated by a dielectric layer. The charge storage element may be formed by a capacitor. The charge storage element may however also be formed by a parasitic capacitive coupling between a conducting line extending between the write transistor and the read transistor of a bit cell and another conductor of the memory device such as a portion of the write select line adjacent to the bit cell.

As realized via the disclosed technology, transistor devices which lend themselves for integration in the interconnection portion/BEOL portion (i.e. transistor devices implemented in materials which may be processed within the reduced thermal budget available during BEOL-processing) may typically be associated with comparably low on-current/low gain. Such transistors may accordingly not be able to by themselves support charging/discharging of bit lines, e.g., as is done in conventional 1T1C DRAM technology. Moreover, the low gain properties may increase the issue of noise during read and access operations. To address these challenges a number of deliberate design choices may be made, herein, which in combination enables reliable memory and read-out performance of the memory device:

Each bit cell of the disclosed technology is configured to include a charge storage element, a dedicated write transistor and a dedicated read transistor. The bit cell may accordingly be referred to as a 2T1C bit cell. The write transistor enables a charge to be transferred to and stored by the charge storage element. The read transistor with the gate electrode being connected to the charge storage element enables the charge stored by the charge storage element to control the gate voltage of the read transistor. Non-destructive read out of the bit cell is thus enabled since the bit cell or the charge storage element need not by itself charge/discharge the sense line but may merely control a current conducted in the sense line. The read transistor may thus provide amplification of a stored bit cell voltage.

The driver circuitry, by being adapted, during the read mode, to apply a voltage to a read select line connected to a selected one of the bit cells, enables an increase or a "boosting" of the gate voltage of the read transistor. Thus, neither of the charge levels stored by the charge storage element corresponding to a logical "1" or a logical "0" need to be large enough for enabling switching of the read transistor out of the sub-threshold region. This enables use of smaller a write current and reduces the storage requirements on the charge storage element. Reference to a threshold voltage of a transistor herein means the gate voltage level at which a transistor is switched from a low conductance state (e.g. an "off state") to a high conductance state (e.g. an "on state").

According to implementations herein, the voltage applied to the read select line may be of such a level that the gate voltage of the read transistor of the selected bit cell is shifted from a ("low-level") voltage resulting when the first charge is stored at the bit cell to the first voltage which is smaller than the threshold voltage of the read transistor and from a ("high-level") voltage resulting when the second charge is stored at the bit cell to the second voltage which is equal to or greater than the threshold voltage of the read transistor. In other words, the voltage applied to the read select line is adapted to cause, or is at a level causing, the gate voltage of the read transistor of the selected bit cell to remain below the threshold voltage of the read transistor (on a condition that a first charge is stored by the charge storage element) or to be shifted to a voltage equal to or greater than the threshold voltage of the read transistor (on a condition that a second charge is stored by the charge storage element of the bit cell).

As used herein, "first charge" may be a charge level corresponding to a first logical level and second "second charge" may be a charge level corresponding to a second logical level. The first logical level may represent a logical "0" and the second logical level may represent a logical "1", or vice versa. The first and second charge levels may be respective predetermined charge levels.

Accordingly, the first charge level (corresponding to the low-level voltage) and the second charge level (corresponding to the high-level voltage) storable by the bit cell may be readily distinguished from each other. Noise tolerance is also improved. By the "high-level" voltage and the "low-level" voltage is hereby meant two different voltage levels, both being smaller than the threshold voltage of the read transistor and the "high-level" voltage being higher than the "low-level" voltage.

The voltage applied to the read select line by the driver circuitry during the read mode may be a voltage of a predetermined level. The voltage may be referred to as a read voltage or a read control voltage. The voltage may be applied to the first electrode of the charge storage element of a selected bit cell of one of the bit cell stacks. A "selected" bit cell should here be understood as a bit cell connected to the read select line to which the read voltage is applied.

The plurality of gain transistors, each gain transistor being connected to a respective one of the bit stacks via, i.e. by being connected to, the sense lines enables amplifying of the read out signal (i.e. a voltage level on a sense line). A "double gain implementation" is thereby enabled since a stored bit cell voltage may be amplified twice: first by the read transistor of a bit cell and secondly by a gain transistor connected to the bit cell stack including the bit cell. This double gain implementation enables use of smaller a write current and reduces the storage requirements on the charge storage element as well as improves the noise resistance during read out.

Forming the plurality of gain transistors in the semiconductor device layer, i.e. in the FEOL-portion, allows the gain transistors to be formed using conventional FEOL-processing in high quality semiconductor material without the low thermal budget constraints imposed on the process for forming the bit cell transistors. High quality gain transistors supporting high on-currents/high gain may hence be used for amplifying a read out signal received from a sense line connected to a bit cell which is selected for read out. The typically lower gain of the read transistor of the bit cells may thereby be compensated for.

Each gain transistor may be a FET of either a p-type or an n-type. The amplified output of the gain transistor may be provided to a sense amplifier of the device. The sense amplifier may be adapted to amplify and optionally latch the read out signal.

Each gain transistor may include a gate electrode connected to the sense lines connected to the associated bit cell stack. Each gain transistor may further include a first electrode connected to an input of a sense amplifier. Each gain transistor may further include a second electrode connected to ground.

As used herein, the term DRAM refers to a memory wherein data is stored by predetermined levels of charges by a capacitive charge storage element of each bit cell. As may be understood from the above, and as will be further described below, the bit cells of the disclosed technology enable non-destructive read out and may present comparably low charge leakage. Non-destructive read out in combination with a low charge leakage enables a DRAM with reduced refresh rate compared to typical prior art DRAM technology wherein a reduced power consumption is enabled. In fact, the memory device may even enable a refresh-less data storage.

As used herein, driver circuitry means any circuitry, i.e., a combination of devices and other circuit elements, being able to apply voltages/currents to other circuitry of the memory device. The driver circuitry may include buffers, current sources, voltage sources and logic circuitry for controlling and selectively applying the voltages/currents to circuitry of the memory device in accordance with various modes of operations of the memory device. The driver circuitry may include semiconductor devices forming part of the FEOL-portion.

The term "read mode" refers to a mode of operation of the memory device during which the memory device is adapted to access one or more bit cells of the stacks in order to read out data stored by the bit cells.

Conversely, the term "a write mode" is used to refer to a mode of operation of the memory device during which the memory device is adapted to charge bit cells of the stacks to the first charge level (e.g., to store a "0") or to the second charge level (e.g., to store a "1") in order to write data to be stored by the bit cell.

According to one embodiment, the threshold voltage of the read transistor of each bit cell of each bit stack is greater than a threshold voltage of the write transistor of the bit cell. This enables the read/write window of the bit cell to be increased since a greater charge may be stored at the charge storage element without exceeding the threshold voltage of the read transistor.

According to one embodiment, the driver circuitry may be adapted, during a write mode, to apply one of a first write voltage and a second write voltage to the write bit line connected to a selected one of the bit cells of a bit stack and to apply a voltage to the write select line connected to the selected bit cell such that one of the first charge and the second charge is stored at the charge storage element of the selected bit cell. Accordingly, selected bit cells may be charged whereby two logic levels may be stored in the bit cell. The voltage applied to the write select line (which may be referred to as a write voltage or write control voltage) may be equal to or greater than the threshold voltage of the write transistor.

According to embodiments herein, the read transistor of each bit cell of each bit stack includes a first electrode connected to the sense line and a second electrode connected to a read bit line, and wherein the driver circuitry may be further adapted, during the read mode, to shift a second electrode voltage of the read transistor from a third voltage to a fourth voltage. More specifically, the driver circuitry may be adapted to apply a voltage to the read bit line such that the second electrode voltage of the read transistor is shifted from the third voltage to the fourth voltage.

Such embodiments enable a bias across the first and second terminal of the read transistor to be increased during the read mode wherein the signal level in the sense line may be increased. This enables faster and more reliable read-out operation.

The third voltage may be a predetermined low voltage level and the fourth voltage may be a predetermined high voltage level, or vice versa.

The driver circuitry may be further adapted to during a precharge mode (preceding the read mode) precharge the sense line connected to the read transistor of each bit cell of a selected bit stack to a fifth voltage. By precharging the sense line to a fifth voltage the sense line may be prepared for the read mode and put into a well-defined state. "Precharging" should hereby be understood as an act causing the voltage level of the sense lines to match or be equal to a predetermined voltage, more specifically the fifth voltage. Depending on the voltage of the sense lines prior to the precharging, the fifth voltage may be obtained by either discharging or charging of the sense lines.

The precharge voltage, i.e. the fifth voltage, should preferably be of a level such that the gain transistor is not closed (i.e. remains open) during the precharge mode.

The level of the fifth voltage may be closer to the level of the third voltage than the level of the fourth voltage. A bias between the first and second electrodes of the read transistor may thus be increased during the read mode, compared to the precharge mode. Thereby, a faster read-out is enabled. The fifth voltage may even correspond to or be equal to the above-mentioned third voltage. Accordingly a zero-bias may be applied between the first and second electrodes of the read transistor during the precharge mode.

The driver circuitry may be adapted to precharge the senses line by connecting the sense line to a voltage reference and may be further adapted, prior to applying the voltage to the read select line, to disconnect the sense line from the voltage reference. The driver circuitry may be adapted to keep the sense line disconnected from the voltage reference while the voltage is applied to the read select line by the driver circuitry, i.e. concurrent to said voltage being applied to the read select line. The sense lines connected to a selected bit cell stack may hence be precharged and subsequently be prepared for the read mode.

The second electrode of the read transistor of each bit cell may be connected to the first electrode of the write transistor of the bit cell. A write voltage and a read voltage may thereby be supplied to the bit cell via a same conductive path. This enables a more area efficient bit cell layout.

According to one embodiment, a channel region of the read transistor and the write transistor of each bit cell of each bit stack is formed by a wide-band gap semiconductor material. A "wide-band gap" is hereby used to refer to a semiconductor material having a band gap which is greater than conventional group IV semiconductor materials such as Si or SiGe. The channel region of the read transistor and the write transistor of each bit cell may thus be formed as low leakage devices. Advantageous materials include Iridium Gallium Zinc Oxide which enables implementation of read/write transistors with low-leakage properties in BEOL-compatible processes.

A channel region of the write transistor may be formed by a discrete semiconductor material portion.

A channel region of the read transistor may be formed by a discrete semiconductor material portion.

The channel regions of the read transistor and the write transistor may be formed by different and separate semiconductor material portions.

A channel region of each gain transistor may be formed by a group IV material layer, preferably by mono-crystalline Si.

Each gain transistor may be arranged below the respective one of the plurality of bit cell stacks.

According to a second aspect there is provided a method for operating a random access memory, or RAM. Here, the RAM may include a substrate supporting a semiconductor device layer in which a plurality of semiconductor devices are formed. The RAM may further include an interconnection portion formed above the substrate and including a number of metallization levels and dielectric layers, the interconnection portion being adapted to interconnect the semiconductor devices. The RAM may further include a plurality of bit cell stacks arranged in the interconnection portion, each bit cell stack including a plurality of bit cells. Further, each bit cell may include: (i) a charge storage element, a write transistor and a read transistor, wherein the write transistor includes a gate electrode connected to a write select line and a first electrode connected to a write bit line, wherein the charge storage element includes a first portion connected to a read select line and a second portion connected to a second electrode of the write transistor and to a gate electrode of the read transistor, and wherein the read transistor includes an electrode connected to a sense line, and (ii) a plurality of gain transistors formed in the semiconductor device layer, each gain transistor being connected to a respective one of the bit stacks via the sense lines connected to the read transistor of each bit cell of the respective bit stack and being adapted to output an amplified read out signal.

Aspects of such method(s) may include, during a read mode, applying a voltage to a read select line connected to a selected one of the bit cells of the bit cell stacks such that a gate voltage of the read transistor of the bit cell, on a condition that a first charge is stored by the charge storage element of the bit cell, is shifted to a first voltage which is smaller than a threshold voltage of the read transistor and, on a condition that a second charge is stored by the charge storage element of the bit cell, is shifted to a second voltage which is equal to or greater than a threshold voltage of the read transistor.

The read transistor of each bit cell of each bit stack may include a first electrode connected to the sense line and a second electrode connected to a read bit line, wherein the method may further comprise, during the read mode, shifting a second electrode voltage of the read transistor of the selected bit cell from a third voltage to a fourth voltage.

The method may further comprise, during a precharge mode (preceding the read mode), precharging the sense line connected to the read transistor of the selected bit cell to a fifth voltage.

The sense line may be precharged by connecting the sense line to a voltage reference wherein the method may further comprise disconnecting the sense line from the voltage reference prior to applying the voltage to the read select line.

The act of precharging may be applied to each sense line connected to the bit stack stack of the selected bit cell.

According to a third aspect there is provided a method for operating a random access memory, or RAM. Here, the RAM may include a substrate supporting a semiconductor device layer in which a plurality of semiconductor devices are formed. The RAM may further include an interconnection portion formed above the substrate and including a number of metallization levels and dielectric layers, the interconnection portion being adapted to interconnect the semiconductor devices. The RAM may further include a plurality of bit cell stacks arranged in the interconnection portion, each bit cell stack including a plurality of bit cells. Further, each bit cell may include: (i) a charge storage element, a write transistor and a read transistor, wherein the write transistor includes a gate electrode connected to a write select line and a first electrode connected to a write bit line, wherein the charge storage element includes a first portion connected to a read select line and a second portion connected to a second electrode of the write transistor and to a gate electrode of the read transistor, and wherein the read transistor includes an electrode connected to a sense line, and (ii) a plurality of gain transistors formed in the semiconductor device layer, each gain transistor being connected to a respective one of the bit stacks via the sense lines connected to the read transistor of each bit cell of the respective bit stack and being adapted to output an amplified read out signal.

According to some implementations, the method may include, during a write mode applying one of a first write voltage and a second write voltage to a write bit line connected to a selected one of the bit cells of the bit cell stacks and applying a voltage to the write select line connected to the selected bit cell such that a first charge and a second charge is stored by the charge storage element of the selected bit cell.

The first write voltage may be a predetermined low-level voltage and the second write voltage may be a predetermined high-level voltage.

The first write voltage and the second write voltage may be less than a threshold voltage of the read transistor.

The above methods according to the second and third aspects generally provide the same or corresponding advantages as those discussed in connection with the first aspect. Reference is therefore made to the above discussion concerning advantages associated with the first aspect, but also to the above discussion of details, embodiments and optional features with respect to the first aspect, which apply correspondingly to the second and third aspect.

BRIEF DESCRIPTION OF THE DRAWINGS

The above, as well as additional objects, features and advantages of the presently disclosed technology, will be better understood through the following illustrative and non-limiting detailed description of exemplary embodiments of the disclosed technology, with reference to the appended drawings. In the drawings like reference numerals will be used for like elements unless stated otherwise.

DETAILED DESCRIPTION OF CERTAIN EMBODIMENTS

Detailed embodiments of the disclosed technology will now be described with reference to the drawings. The disclosed technology may, however, be embodied in many different forms and should not be construed as limited to the embodiments set forth herein; rather, these embodiments are provided by way of example so that this disclosure will convey the scope of the disclosed technology to those skilled in the art.

Figures 1A, 1B:
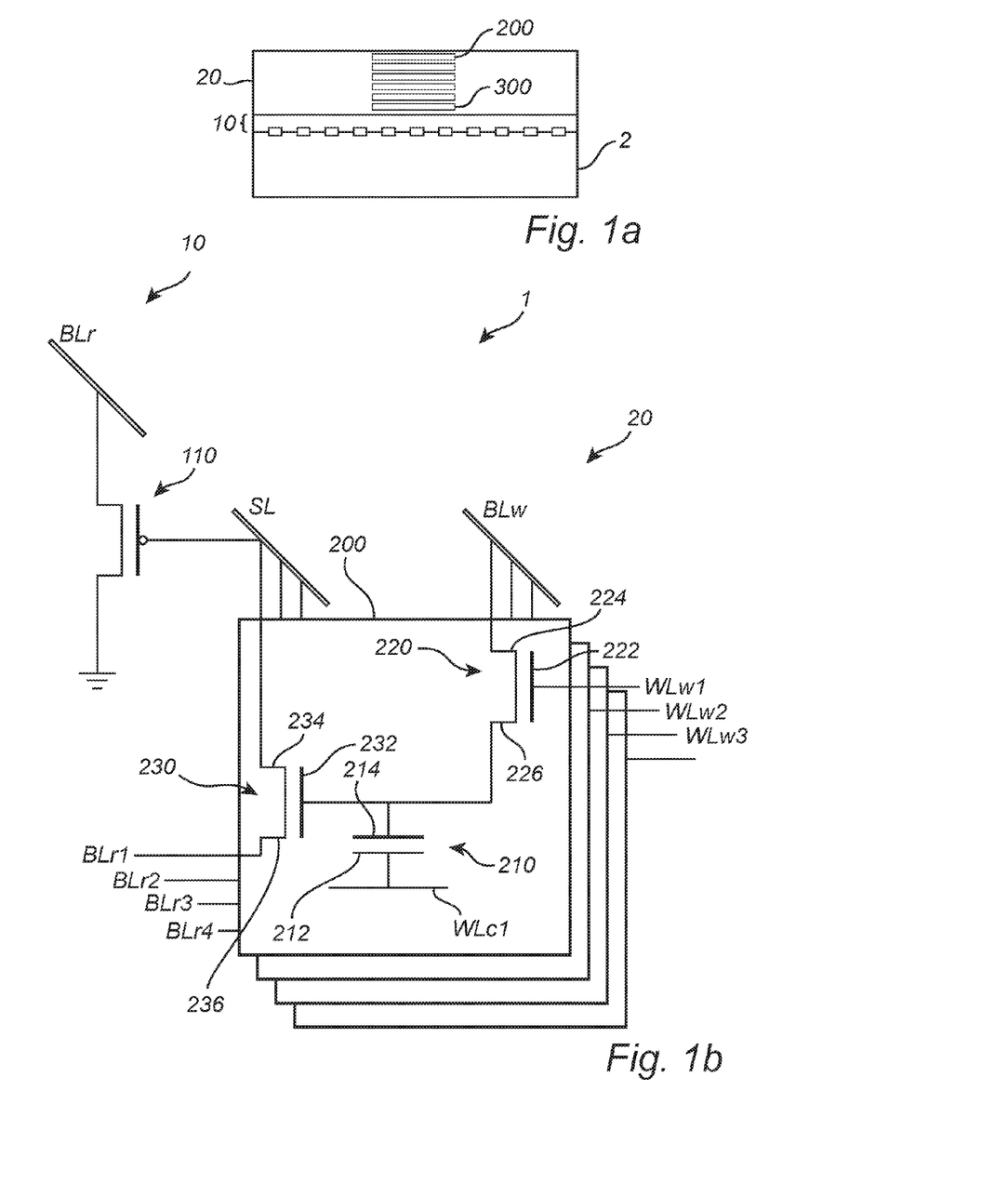
FIGS. 1A and 1B are schematic illustrations of a first memory device.

With reference to FIGS. 1A and 1B, there is shown a memory device 1 for a dynamic access memory, DRAM. FIG. 1A schematically shows a cross-section of a memory device 1 formed on a substrate 2. Only portions of the layers forming part of the structure are shown and the layers may extend laterally/horizontally beyond the illustrated portions. It should also be noted that for the purpose of clarity the various layers and other features of the stacks are not drawn to scale and their relative dimensions, in particular their thickness, may differ from a physical stack.

As shown in FIGS. 1A and 1B the memory device 1 may comprise a substrate 2 supporting a semiconductor device layer 10. The semiconductor device layer 10, or shorter device layer 10, may include a portion of a semiconductor substrate and a plurality of semiconductor devices supported by the portion of the semiconductor substrate. Further, the memory device 1 may comprise an interconnection portion 20 that is formed above the device layer 10 and adapted to interconnect the semiconductor devices. The device layer 10 may also be referred to as the front end of line (FEOL) portion 10 of the device 1. The FEOL portion 10 and the semiconductor devices thereof may be formed using conventional FEOL processing such as defining channel regions, forming device isolation (e.g. STI), source/drain implantation, gate deposition etc. The FEOL processing may further include deposition of a dielectric layer for isolating the FEOL portion 10 from the metallization layers of the interconnection portion 20.

The interconnection portion 20 may include one or several metallization levels embedded in a dielectric layer, such as e.g. $SiO_2$. Each metallization level may include a metallization layer forming conductive paths or tracks. The interconnection portion 20 may further include vias for interconnecting different metallization layers. Additional layers of dielectric material may also be present between the metallization layers. These layers may e.g. have the functions of a passivation layer, etch stop layer or diffusion barrier. The interconnection portion 20 may be referred to as the back end of line (BEOL) portion 20 of the device 1.

As indicated in FIGS. 1A and 1B, the BEOL portion 20 may comprise a plurality of stacked bit cells arranged above each other, wherein the bit cell 200 represents a top-most bit cell of the stack and the bit cell 300 represents a bottom bit cell of the stack. Each bit cell may be arranged in or between different metallization levels of the BEOL portion 20. The BEOL portion 20 may be formed by for instance damascene style BEOL processing wherein each metallization level is formed by patterning and etching a dielectric layer and filling the patterns with a metal. Vias may be formed by etching holes in the dielectric and filling the holes with a metal.

Even though not shown in FIGS. 1A and 1B, it should be understood that the device 1 may comprise a plurality of bit cell stacks arranged in one or two-dimensional arrays. Hence the device 1 may include one or more three-dimensional bit cell arrays.

Each bit cell 200 of a stack may comprise a charge storage element 210, a write transistor 220 and a read transistor 230. The charge storage element 210 may comprise a first portion 212 and a second portion 214 that may be capacitively coupled to each other and adapted to at least temporarily store an electric charge representing a logic state of the bit cell 200. The charge storage element 210 may also be referred to as a capacitor, and the capacitance associated with the element 210 may be provided by means of a parasitic capacitance of the layout of the memory device 1 and/or of dedicated capacitor plates 212, 214. The write transistor 220 and the read transistor 230 of a bit cell 200 may be formed at the same metallization level in the BEOL portion 20, e.g. in a dielectric layer between the metallization layers of adjacent metallization levels. It will however be appreciated that the write and read transistors 220, 230 in some examples also may be formed at different levels. Similarly, the capacitor 210 may be arranged at the same level as one or both of the transistors 220, 230. Alternatively, the capacitor 210 may be arranged at a level above or below at least one of the transistors 220, 230.

The write transistor 220 may comprise a gate electrode 222 connected to a write select line or write word line WLw1, for addressing or selecting that specific write transistor 220 during a write operation. The write transistor 220 may further comprise a first electrode 224 and a second electrode 226 forming source/drain electrodes of the write transistor 220. The first electrode of the write transistor 220 may be connected to a write bit line BLw, whereas the second electrode of the write transistor 220 may be connected to the second portion 214 of the capacitor 210. Thus, the write voltage required for charging the capacitor 210 may be provided from the write bit line BLw via the write transistor 220 in its selected, or closed state (i.e. conducting state). As illustrated in the exemplifying embodiment of FIG. 1b, each bit cell 200 of a stack may be individually addressed by separate write word lines WLw1, WLw2, WLw3, WLw4 and written using a common write bit line BLw.

The first portion 212 of the capacitor 210 may be electrically connected to a read select line or read word line WLc1, whereas the second portion 214 may be connected to the gate electrode 232 of the read transistor 230. Put differently, the capacitor 210 provides a capacitive coupling between the read word line WLc1 and the gate terminal 232 of the read transistor 230. Depending on the charge level of the capacitor 210, the read word line WLc1 may hence during a read mode (described below) be used for changing the conducting state of the read transistor 230. The voltage applied to the read word line WLc1 may be provided by driver circuitry (not shown in FIG. 1b) which may be arranged in the FEOL 10. The read voltage may e.g. be pulsed and/or synchronized with other pulses used for operating the memory device 1.

The read transistor 230 may, as already mentioned, comprise a gate electrode 232 that is connected to the second portion 214 of the capacitor 210. The other electrodes of the read transistor 230, i.e., the first electrode 234 and the second electrode 236, forming source/drain electrodes of the read transistor 230, may be connected to a sense line SL and a read bit line BLr1, respectively. In its closed or conducting state, the read transistor 230 may allow a read current to flow between the sense line SL and the read bit line BLr1, thereby allowing charging or discharging of the sense line SL. As will be further described below, charging or discharging of the sense line SL may be sensed and interpreted as a logic state, i.e. a logic "1" or "0".

The sense line SL of each bit cell 200 of a stack may be connected to a gain transistor 110, which may be arranged in the FEOL portion 10 and common to the bit cells of each stack. The gain transistor 110, which e.g. may be a monocrystalline silicon transistor (e.g. a field-effect transistor, FET, for instance a MOSFET) formed in the FEOL portion 10, may be configured to amplify the read out signal and transmit it to a common or global read bit BLr of the memory device 1.

The write transistor 220 and the read transistor 230 in each bit cell 200 may be a FET, e.g. an n-type FET, whereas the gain transistor 230 may be a p-type or an n-type FET as will be further described below. The transistors 220, 230 of the bit cell 200 and the capacitor 210 may be produced in a metallization level of the BEOL portion 20. The transistors 220, 230 of the bit cell 200 may be formed by deposition of a semiconductor material of for instance Indium Gallium Zinc Oxide (IGZO) or other wide-band gap material. An Indium Zinc Oxide (IZO) material may also be used. The semiconductor material may be formed as a thin film. A gate dielectric layer may be deposited on the semiconductor material. The semiconductor material of each transistor 220, 230 may be embedded in a dielectric layer portion and connected to a metallization layer by conductive paths and vias of the BEOL portion 20. The semiconductor material of each transistor 220, 230 may typically be formed (e.g. by patterning and etching of the semiconductor material or by selective deposition of the semiconductor material) to present a lateral or in-plane extension within the BEOL portion 20 which is confined to the lateral extension of the bit cell 200. That is, the channel region of each transistor 220, 230 of the bit cell 200 may be formed by a discrete semiconductor material portion. The semiconductor material forming the channel region of each transistor 220, 230 of each bit cell may be localized to each bit cell and not be shared with bit cells of adjacent bit stacks or bit cells of the same bit stack.

The gate electrode 222 of the write transistor 220 may be formed by a via which may be connected to the write word line WLw1. The first electrode 224 of the write transistor 220 may be formed by a via which may be connected to the write bit line BLw. The second electrode 226 of the write transistor 220 may be formed by a metal track which may be connected to the second portion 214 of the capacitor 210. The gate electrode 232 of the read transistor 230 may be formed by a metal track which may be connected to the second portion 214 of the capacitor 210. The first electrode 234 of the read transistor 230 may be formed by a via which may be connected to the sense line SL. The second electrode 236 of the read transistor 230 may be formed by a via which may be connected to the read bit line BLr1. The first and second portions 212, 214 of the capacitor 210 may be formed by a pair of parallel metal layers formed in the BEOL portion 20. The conductive portions may similar to the channel regions of the transistors 220, 230 be localized to each bit cell. The first portion 212 of the capacitor may be connected to the read word line WLc1 by a via. However, the first portion 212 may also be formed by a portion of the read word line WLc1. The write word line Wlw1, the write bit line BLw, the sense line SL, the read bit line BLr1 and the read word line WLc1 may be arranged in a metallization layer of the metallization level of the bit cell 200 or in a metallization layer of a metallization level adjacent to the metallization level of the bit cell 200.

Processes for forming the transistors 220, 230 and the capacitor 210 in a manner which is compatible with the other layers and materials of the BEOL portion 20 are per se known to the skilled person and will not be further described herein.

A write mode will now be described with reference to the bit cell 200. Typically, the write mode and the read mode (described below) are not performed simultaneously. Thus, no voltage, i.e. a voltage corresponding to ground, is applied to the read word line WLc1 during the write mode. During a write mode a bit cell 200 may be written by the driver circuitry applying a write voltage or write control voltage to the write word line WLw1. The write voltage may be a predetermined voltage level equal to or exceeding the threshold voltage of the write transistor 220. In other words, the write voltage may be sufficient for closing the write transistor 220 such that the data, in the form of an electrical charge, may be transmitted as a write current from the write bit line BLw to the capacitor 210. Preferably, the charge supplied to the capacitor 210 should be low enough not to close the read transistor 230. I.e. the supplied charge should not result in a voltage at the gate electrode of the read transistor 230 exceeding a threshold voltage of the read transistor 230. The voltage applied by the driver circuitry to the write bit line Blw during the write mode may be one of a predetermined high voltage level and a predetermined low voltage level (e.g. for storing a logical "1" or "0", respectively, or vice versa). Depending on the voltage level of the bit cell 200 upon closing of the write transistor 220 the capacitor 210 may be charged, discharged or maintained at the previous charge level (i.e. if the data written is the same as the data already stored in the bit cell 200). Once the bit cell 200 has been written, i.e., once the capacitor 210 has been charged/discharged, the voltage at the gate electrode 222 of the write transistor 220 may be reduced so as to turn the write transistor 220 off. The driver circuitry may reduce the voltage applied to the write word line WLw1 to a predetermined voltage level less than the threshold voltage of the write transistor 220, for instance corresponding to ground.

Thus, in a typical write operation, the driver circuitry may be adapted to apply the write voltage in the form of a (rectangular) pulse to the write word line WLw1. A high level of the pulsed write voltage may meet or exceed the threshold voltage of the write transistor 220. The low level or base line of the write voltage may be less than the threshold voltage of the write transistor 220. The driver circuitry may further be adapted to apply the predetermined voltage level corresponding to the logical level to be stored (i.e. a "1" or "0") on the write bit line Blw for the duration of the pulsed write voltage wherein the capacitor 210 accordingly may be charged/discharged or maintained.

A read mode will now be described with reference to the bit cell 200. Typically, no voltage, for instance a voltage corresponding to ground, or another sub-threshold voltage is applied to the write word line WLw1 during the read mode. During a read mode a read voltage may be applied by the driver circuitry to the capacitor 210 via the read word line WLc1. Each bit cell 200 may be individually addressed by separate read word lines WLc, which may be used for applying a voltage of a predetermined level that, in case the capacitor 210 stores a first charge (e.g. corresponding to a logic "0"), shifts the voltage at the gate electrode 232 of the read transistor 230 to a first level which is lower than required for switching the read transistor 230 on, and, in case the capacitor 210 stores a second charge (e.g. corresponding to a logic "1"), shifts the voltage at the gate electrode 232 of the read transistor 230 to second a level which is sufficient for switching the read transistor 230 on. Even though not indicated in the figures, the read word line WLc may be connected to bit cells in different stacks, such as bit cells arranged at the same level in a plurality of stacks.

The threshold voltage of the read transistor 230 may be greater than a threshold voltage of the write transistor 220. This allows for a greater charge to be stored at the capacitor 210 without exceeding the threshold voltage of the read transistor 230, and thus for an increased read/write window of the bit cell 200. The difference in threshold voltage may e.g. be achieved by varying the doping level of the write transistor 220 or the read transistor 230.

Further, the (not shown) driver circuitry may be adapted to during a precharge mode precharge the sense lines SL. The driver circuitry may comprise a precharge transistor. The precharge transistor may be of a similar type as the gain transistor 110. The precharge transistor may be adapted to precharge the sense lines SL connected to the read transistor 230 of each bit cell 200 of a bit stack to a fifth voltage prior to the read out of the data in each cell 200. The "fifth" voltage or "precharge" voltage may typically be such that the gain transistor is open or off. The "precharge" voltage may also be selected to be as close as possible to the threshold voltage of the gain transistor to speed up the read, but sufficiently far removed from the threshold voltage to avoid noise causing the gain transistor to switch on. The precharge transistor may connect the sense lines SL to a voltage reference adapted to provide a voltage level corresponding to the precharge voltage.

The drive circuitry may be adapted to during the read mode disconnect the sense lines SL from the voltage reference and keep the sense lines SL disconnected from the voltage reference for the duration of the read voltage applied to the read word line WLc1.

The driver circuitry may further be adapted to, during the read mode and following the pre-charge mode, shift the voltage at the second electrode 236 of the read transistor 230 from a third voltage to a different, fourth, voltage. Thereby a changed biasing between the first and second electrodes 234, 236 of the read transistor 230 may be achieved during the read mode, wherein the bias corresponds to the difference between the precharge voltage and the fourth voltage.

The third voltage may be equal to the precharge voltage wherein the biasing between the first and the second electrodes 234, 236 may be changed from a zero-bias (during the precharge mode) to a non-zero bias (during the read mode). More generally, the level of the fifth voltage may be closer to the level of the third voltage than the level of the fourth voltage such that the bias between the electrodes 234, 236 of the read transistor 230 may be increased during the read mode, compared to the precharge mode.

Thus, in a typical precharge operation, the driver circuitry may apply a control voltage to the precharge transistor gate such that the voltage reference is connected to the sense lines SL. Prior to entering the read mode (i.e. prior to applying the read voltage to the read word line WLc1 of the selected bit cell 200) the driver circuitry may apply a control voltage to the pre-charge transistor gate such that the voltage reference is disconnected from the sense lines SL. In the read mode, the driver circuitry applies the read voltage to the read word line WLc1 of the selected bit cell 200. The read voltage may typically be applied in the form of a (rectangular) pulse to the read word line WLc1. A high level of the pulsed read voltage may be such that the gate voltage of the read transistor 230 is shifted to the first or second voltage (i.e. depending on the charge level of the capacitor 210). The low level or base line of the read voltage may for instance correspond to a ground voltage. Thus, for the duration of the read voltage pulse, the gate voltage of the read transistor 230 may be shifted to the first or the second voltage. The read transistor 230 may accordingly either be closed or remain open. The driver circuitry may further shift the voltage applied to the second electrode 236 of the read transistor 230 in a synchronized manner with respect to the pulsed read voltage wherein a bias may be formed between the source and drain of the read transistor 230, as described above. The sense lines SL may accordingly be maintained at the precharge voltage or be charged/discharged.

The third voltage may be greater than the fourth voltage. The third voltage may be a predetermined high voltage level and the fourth voltage may be a predetermined low voltage. The third voltage may be a positive supply voltage and the fourth voltage may be a ground voltage. The sense lines SL may be precharged to a predetermined high or positive voltage. A predetermined low voltage or ground voltage may be applied to the second electrode 236 during the read mode. A read current may thus flow from the sense lines SL to the bit read line BLr1 on a condition that the read transistor 230 of the bit cell 200 is closed by the read voltage applied to the read word line WLc1. In this implementation, the pre-charge transistor and the gain transistor 110 are preferably p-type FETs (e.g. pMOSFETs). The read current may be amplified by the gain transistor 110, the output of which may be sensed by a sense amplifier connected to the common or global bit line BLr and interpreted as a logical state, i.e. a logic "1" or "0" in a conventional manner. On a condition that the read transistor 230 remains open when the read voltage is applied to the read word line WLc1 there will be (substantially) no read current. There will accordingly be no discharging of the sense lines SL or the bit line BLr. This may be interpreted as an opposite logic state, i.e. a logical "0" or "1", respectively, in a conventional manner.

Alternatively, the third voltage may be smaller than the fourth voltage. The third voltage may be a predetermined low voltage level and the fourth predetermined voltage may be a predetermined high voltage. The fourth predetermined voltage may be a positive supply voltage and the third predetermined voltage may be a ground voltage. The sense lines SL may be precharged to a predetermined low voltage or ground voltage. A predetermined high voltage or a positive supply voltage may be applied to the second electrode 236 during the read mode. A read current may thus flow from the bit read line BLr1 to the sense lines SL on a condition that the read transistor 230 of the bit cell 200 is closed by the read voltage applied to the read word line WLc1. In this implementation, the pre-charge transistor and the gain transistor 110 are preferably n-type FETs (e.g. nMOSFETs). The read current may be amplified by the gain transistor 110, the output of which may be sensed by a sense amplifier connected to the common or global bit line BLr and interpreted as a logical "1" in a conventional manner. On a condition that the read transistor 230 remains closed when the read voltage is applied to the read word line WLc1 there will be (substantially) no read current. There will accordingly be no charging of the sense lines SL or the bit line BLr which may be interpreted as a logical state, i.e. a logic "0" or "1" in a conventional manner.

Figure 2:
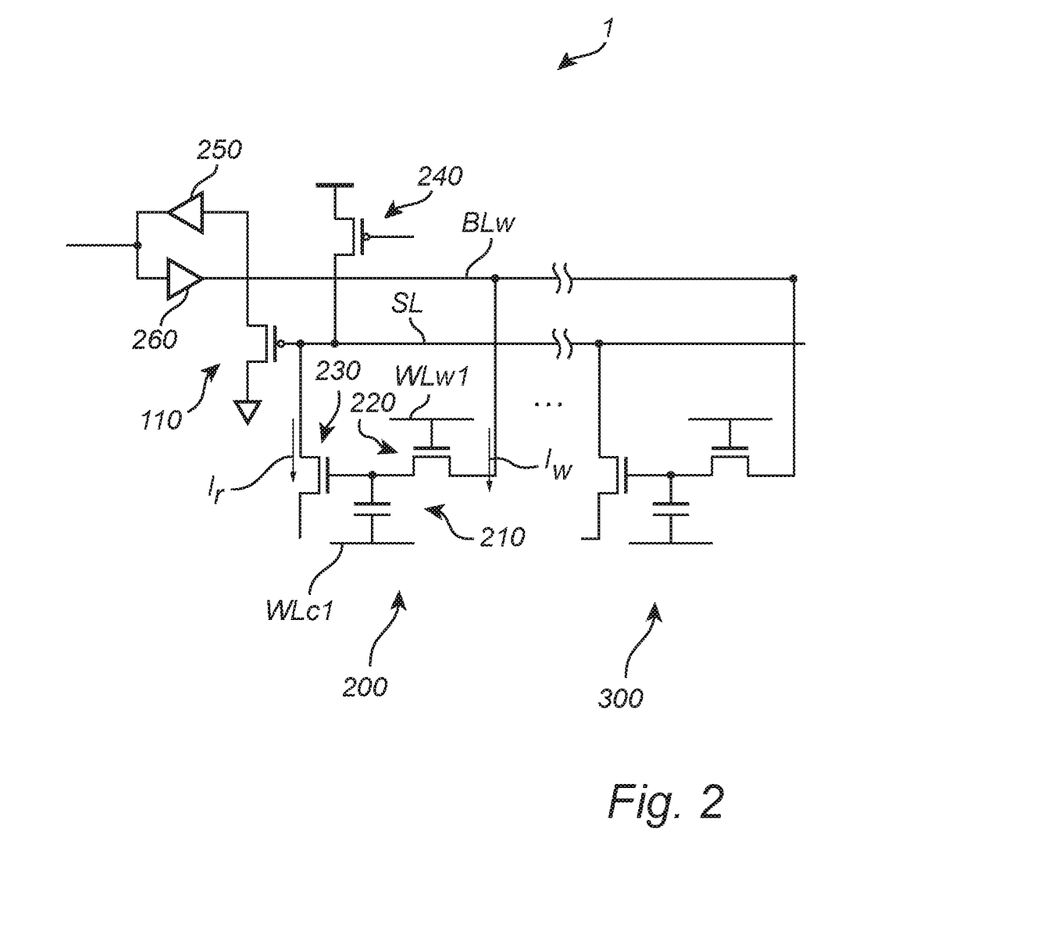
FIG. 2 shows a circuit schematic of a bit cell stack of the first memory device.

FIG. 2 shows a circuit layout of a bit cell stack of the memory device 1 shown in FIGS. 1a and 1b. In addition to what is disclosed in FIGS. 1a and 1b, the present figure also illustrates a sense amplifier circuitry 250 for receiving the read out from the gain transistor 110. The sense amplifier circuitry 250 may e.g. be a latch-type sense amplifier comprising two cross-coupled inverters and being connected to two different read bit lines BLr. Further, a write driver circuitry 260 is disclosed, which is configured for supplying the write bit line BLw with the write voltage required for writing data to the bit cells of the bit cell stack. In the present figure, the stacked configuration of the bit cells is schematically illustrated by two bit cells 200, 300, of which the latter bit cell is merely indicated.

During the write operation, the write driver circuitry 260 drives a write current $I_w$ through the write transistor 220 so as to charge the capacitor 210 with e.g. a logic "1". During the read operation, a read current $I_r$ may flow through the read transistor 230, thereby changing the potential at which the sense line SL has been precharged by the precharge transistor 240. The change in voltage level in the sense line SL may cause the gain transistor 110 to close and allow the data bit stored in the capacitor 210 to be provided to the sense amplifier circuitry 250 in the form of an amplified read out current.

Figure 3:
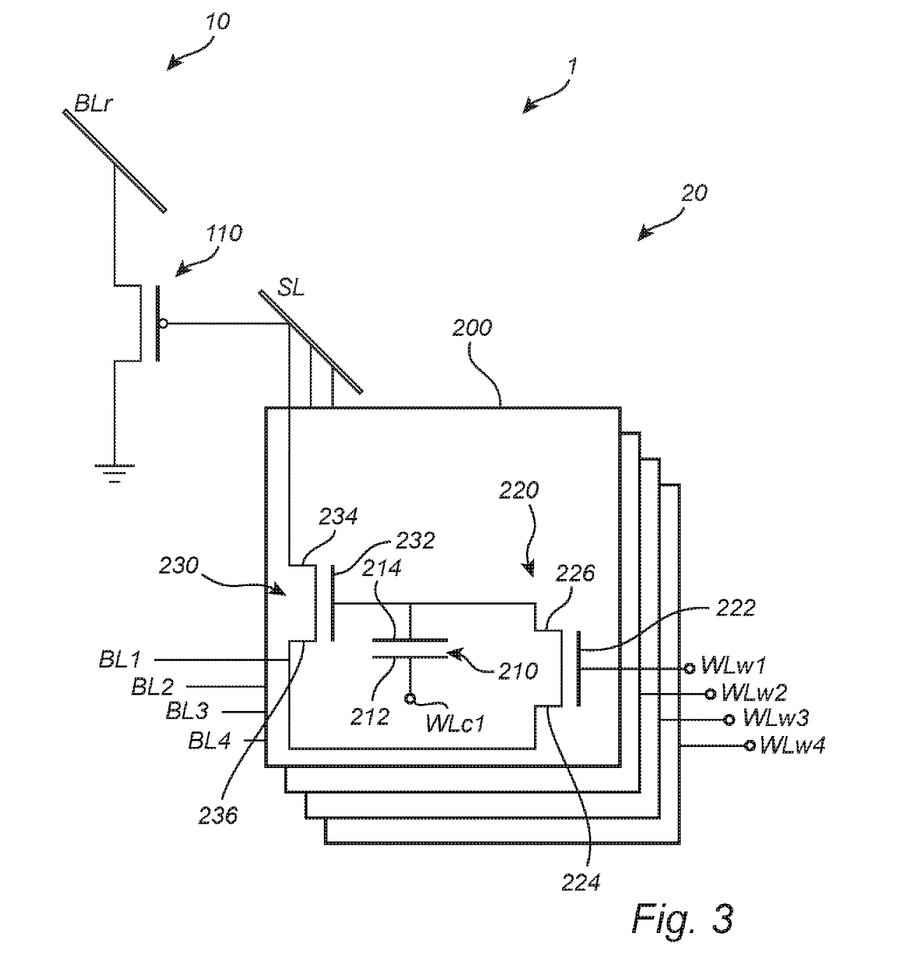
FIG. 3 is a schematic illustration of a second memory device.

FIG. 3 shows a further memory device which may be similarly configured as the memory device 1 described with reference to FIGS. 1 and 2. In FIG. 3, however, the first electrode 224 of the write transistor 220 may be electrically connected to the second electrode 236 of the read transistor 230 instead of a separate write bit line BLw as shown in FIGS. 1 and 2. In other words, the read bit line BLr1 and the write bit line BLw may be formed of a shared, or combined bit line BL1. The write operation and the read operation of the bit cell 200 according to FIG. 3 may thus be performed in a similar manner as described in connection with the examples of FIGS. 1A, 1B and 2, with the difference that the current required for writing (via write transistor 220) and the current required for reading (via read transistor 230) are supplied from the same bit line BL1. This is possible since reading from and writing to a bit cell 200 typically is not performed simultaneously.

Figure 4:
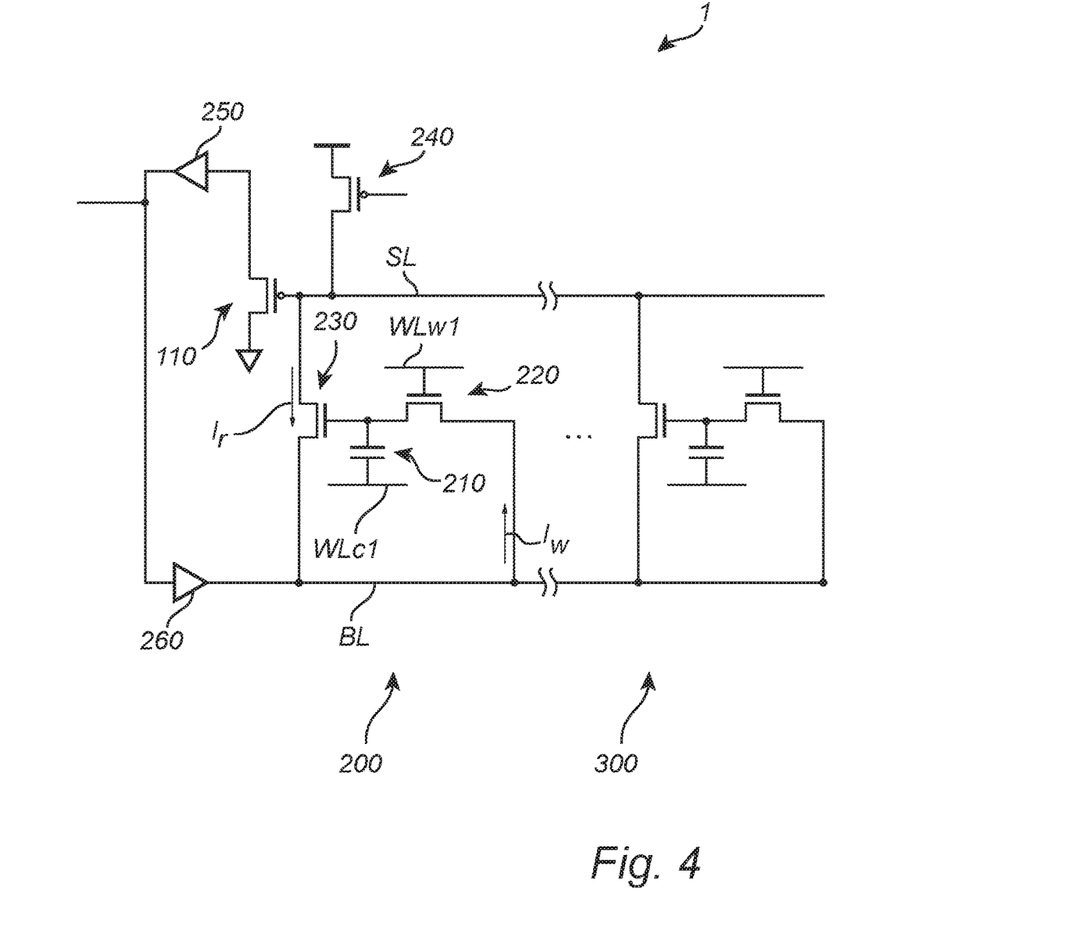
FIG. 4 shows a circuit schematic of a bit cell stack of the second memory device.

FIG. 4 shows a circuit layout of a bit cell stack of the memory device 1 of FIG. 3. The memory device 1 may comprise a sense amplifier circuitry 250 for amplifying the read out signal from the gain transistor 110 of a stack, and a write driver circuitry 260 for providing sufficient voltage to the bit line BL for writing data to each bit cell 200, 300 of the bit cell stack. During the write operation, a write current $I_w$ may flow from the bit line BL, via the read transistor 220 to the capacitor 210 which may be charged with e.g. a logic "1" accordingly. The same bit line BL may also be used during the read operation, wherein a read current $I_r$ is allowed to flow from the sense line SL, via the read transistor 230, to the bit line BL and thereby close the gain transistor 110.

Figure 5:
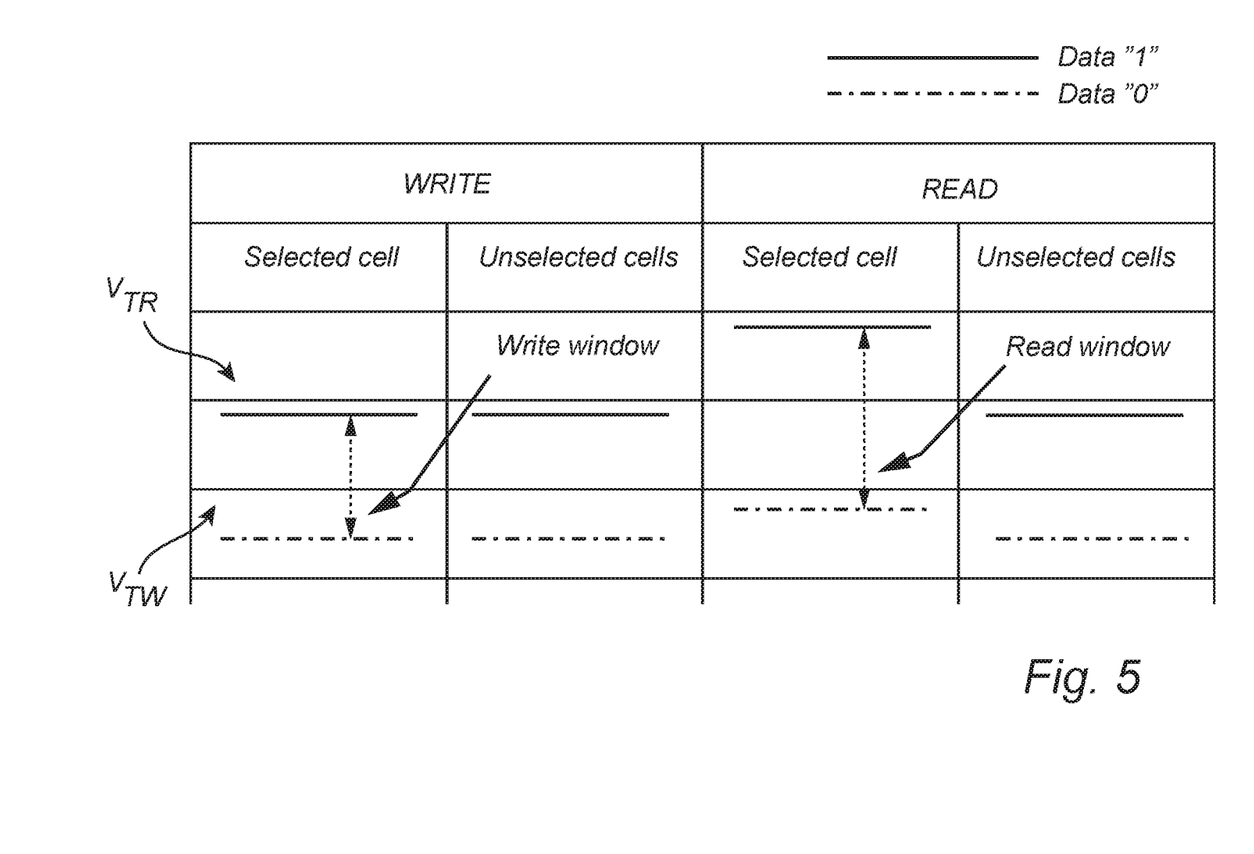
FIG. 5 is a table showing different charge levels of the charge storage element in a read mode and a write mode.

FIG. 5 is table showing the write/read window of a bit cell 200 wherein the threshold voltage $V_{TR}$ of the read transistor 230 is greater than the threshold voltage $V_{TW}$ of the write transistor 220. In the present table, the write/read window is indicated as the difference in charge level of the capacitor 210 corresponding to a logic "1" and a logic "0". During the write mode (the "WRITE" column), the gate voltage of the read transistor 230 should not be above the threshold voltage $V_{TR}$ of the read transistor 230. As shown in the "READ" column the gate voltage of the read transistor 230 of a bit cell storing the second charge level, e.g. storing a logic "1", is during read mode shifted above the threshold voltage $V_{TR}$ of the read transistor (i.e. shifted due to the read voltage applied to the read select line). If the same cell instead stores the first charge level, e.g. storing a logic "0", the shifted gate voltage does however still not exceed the threshold voltage $V_{TR}$ of the read transistor 230. By letting the threshold voltage $V_{TR}$ of the read transistor 230 be greater than the threshold voltage $V_{TW}$ of the write transistor 220, the operation window for the write/read modes may be increased.

In the above the disclosed technology has mainly been described with reference to a limited number of examples. However, as is readily appreciated by a person skilled in the art, other examples than the ones disclosed above are equally possible within the scope of the inventive concept, as defined by the appended claims.

What is claimed is:

1. A memory device for a dynamic random access memory (DRAM) comprising:
    a substrate supporting a semiconductor device layer in which a plurality of semiconductor devices are formed,
    an interconnection portion formed above the substrate and including a number of metallization levels and dielectric layers, the interconnection portion being adapted to interconnect the semiconductor devices,
    a plurality of bit cell stacks arranged in the interconnection portion, each bit cell stack including a plurality of bit cells, each bit cell including:
    a charge storage element, a write transistor and a read transistor, wherein the write transistor includes a gate electrode connected to a write select line and a first electrode connected to a write bit line, wherein the charge storage element includes a first portion connected to a read select line and a second portion connected to a second electrode of the write transistor and to a gate electrode of the read transistor, and wherein the read transistor includes an electrode connected to a sense line,
    driver circuitry adapted to during a read mode apply a voltage to the read select line connected to a bit cell such that a gate voltage of the read transistor of the bit cell, on a condition that a first charge is stored by the charge storage element of the bit cell, is shifted to a first voltage which is smaller than a threshold voltage of the read transistor and, on a condition that a second charge is stored by the charge storage element of the hit cell, is shifted to a second voltage which is equal to or greater than the threshold voltage of the read transistor, and
    a plurality of gain transistors formed in the semiconductor device layer, each gain transistor being connected to a respective one of the bit cell stacks via the sense lines connected to the read transistor of each bit cell of the respective bit cell stack and being adapted to output an amplified read out signal.

2. The device according to claim 1, wherein the threshold voltage of the read transistor of each bit cell is greater than a threshold voltage of the write transistor.

3. The device according to claim 1, wherein the electrode of the read transistor of each bit cell forms a first electrode connected to the sense line and wherein each read transistor further includes a second electrode connected to a read bit line, and wherein the driver circuitry is further adapted during the read mode to shift a second electrode voltage of the read transistor from a third voltage to a fourth voltage.

4. The device according to claim 1, wherein the driver circuitry is further adapted during a precharge mode to precharge the sense line connected to the read transistor of each bit cell of a bit cell stack to a fifth voltage.

5. The device according to claim 4, wherein the driver circuitry is adapted to precharge the sense lines by connecting the sense line to a voltage reference and is further adapted to, prior to applying the voltage to the read select line, disconnect the sense line from the voltage reference.

6. The device according to claim 1, wherein a channel region of the read transistor and the write transistor of each bit cell is formed by a wide-band gap semiconductor material.

7. The device according to claim 1, wherein a channel region of each gain transistor is formed by a group IV material layer.

8. The device according to claim 1, wherein each gain transistor is physically arranged in the semiconductor device layer below the respective one of the plurality of bit cell stacks.

9. The device according to claim 1, wherein the electrode of the read transistor of each bit cell forms a first electrode connected to the sense line and each read transistor further includes a second electrode connected to a read bit line, and wherein the second electrode of the read transistor is connected to the first electrode of the write transistor of the bit cell.

10. A method of operating a random access memory (RAM) having a substrate supporting a semiconductor device layer in which a plurality of semiconductor devices are formed, an interconnection portion formed above the substrate and having a number of metallization levels and dielectric layers, the interconnection portion being adapted to interconnect the semiconductor devices, and a plurality of bit cell stacks arranged in the interconnection portion, each bit cell stack having a plurality of bit cells, each bit cell having a charge storage element, a write transistor and a read transistor, wherein the write transistor includes a gate electrode connected to a write select line and a first electrode connected to a write bit line, wherein the charge storage element includes a first portion connected to a read select line and a second portion connected to a second electrode of the write transistor and to a gate electrode of the read transistor, and wherein the read transistor includes an electrode connected to a sense line, and a plurality of gain transistors formed in the semiconductor device layer, each gain transistor being connected to a respective one of the bit cell stacks via the sense lines connected to the read transistor of each bit cell of the respective bit stack and being adapted to output an amplified read out signal, the method comprising:
during a read mode, applying a voltage to a read select line connected to a bit cell of the plurality of bit cells such that a gate voltage of the read transistor of the bit cell, on a condition that a first charge is stored by the charge storage element of the bit cell, is shifted to a first voltage which is smaller than a threshold voltage of the read transistor and, on a condition that a second charge is stored by the charge storage element of the bit cell, is shifted to a second voltage which is greater than a threshold voltage of the read transistor.

11. The method according to claim 10, wherein the read transistor of each bit cell includes a first electrode connected to the sense line and a second electrode connected to a read bit line, and wherein the method further comprises during the read mode shifting a second electrode voltage of the read transistor of the bit cell from a third voltage to a fourth voltage.

12. The method according to claim 10, further comprising during a precharge mode precharging the sense line connected to the read transistor of the bit cell to a fifth voltage.

13. The method according to claim 12, wherein the sense line is precharged by connecting the sense line to a voltage reference and wherein the method comprises disconnecting the sense line from the voltage reference prior to applying the voltage to the read select line.

14. A method of operating a random access memory (RAM) having a substrate supporting a semiconductor device layer in which a plurality of semiconductor devices are formed, an interconnection portion formed above the substrate and having a number of metallization levels and dielectric layers, the interconnection portion being adapted to interconnect the semiconductor devices, and a plurality of bit cell stacks arranged in the interconnection portion, each bit cell stack having a plurality of bit cells, each bit cell having a charge storage element, a write transistor and a read transistor, wherein the write transistor includes a gate electrode connected to a write select line and a first electrode connected to a write bit line, wherein the charge storage element includes a first portion connected to a read select line and a second portion connected to a second electrode of the write transistor and to a gate electrode of the read transistor, and wherein the read transistor includes an electrode connected to a sense line, and a plurality of gain transistors formed in the semiconductor device layer, each gain transistor being connected to a respective one of the bit cell stacks via the sense lines connected to the read transistor of each bit cell of the respective bit cell stack and being adapted to output an amplified read out signal to a sense amplifier, the method comprising:
during a write mode:
applying one of a first write voltage and a second write voltage to a write bit line connected to a bit cell of the plurality of bit cells, and
applying a voltage to the write select line connected to the bit cell such that one of a first charge and a second charge is stored by the charge storage element of the bit cell.

15. The method according to claim 14, wherein both the first write voltage and the second write voltage are less than a threshold voltage of the read transistor.

16. The device according to claim 2, wherein the electrode of the read transistor of each bit cell forms a first electrode connected to the sense line and wherein each read transistor further includes a second electrode connected to a read bit line, and wherein the driver circuitry is further adapted during the read mode to shift a second electrode voltage of the read transistor from a third voltage to a fourth voltage.

17. The device according to claim 2, wherein the driver circuitry is further adapted during a precharge mode to precharge the sense line connected to the read transistor of each bit cell of a bit cell stack to a fifth voltage.

18. The device according to claim 17, wherein the driver circuitry is adapted to precharge the sense lines by connecting the sense line to a voltage reference and is further adapted to, prior to applying the voltage to the read select line, disconnect the sense line from the voltage reference.

19. The device according to claim 18, wherein a channel region of each gain transistor is formed by a group IV material layer.

20. The device according to claim 1, wherein a channel region of the read transistor and the write transistor of each bit cell is formed of an Indium Gallium Zinc Oxide semiconductor material having a wide-band gap.

* * * * *